United States Patent
Mehta et al.

(10) Patent No.: US 7,514,759 B1
(45) Date of Patent: Apr. 7, 2009

(54) PIEZOELECTRIC MEMS INTEGRATION WITH GAN TECHNOLOGY

(75) Inventors: Sarabjit Mehta, Calabasas, CA (US); David E. Grider, Charlotte, NC (US); Wah S. Wong, Montebello, CA (US)

(73) Assignee: HRL Laboratories, LLC, Malibu, CA (US)

( * ) Notice: Subject to any disclaimer, the term of this patent is extended or adjusted under 35 U.S.C. 154(b) by 361 days.

(21) Appl. No.: 11/104,395

(22) Filed: Apr. 11, 2005

Related U.S. Application Data

(60) Provisional application No. 60/563,598, filed on Apr. 19, 2004.

(51) Int. Cl.
*H01L 29/84* (2006.01)
*H01L 21/00* (2006.01)

(52) U.S. Cl. .................. 257/416; 438/55
(58) Field of Classification Search ............... 438/191, 438/55; 333/187; 310/332; 257/194, 416
See application file for complete search history.

(56) References Cited

U.S. PATENT DOCUMENTS

| | | | |
|---|---|---|---|
| RE32,859 E * | 2/1989 | Marshall et al. | 333/151 |
| 6,204,737 B1 * | 3/2001 | Ella | 333/187 |
| 6,469,677 B1 * | 10/2002 | Schaffner et al. | 343/876 |
| 6,486,502 B1 * | 11/2002 | Sheppard et al. | 257/194 |
| 6,539,774 B1 * | 4/2003 | Zinck et al. | 73/23.2 |
| 6,604,425 B1 * | 8/2003 | Hsu et al. | 73/718 |
| 6,639,249 B2 * | 10/2003 | Valliath | 257/88 |
| 6,787,387 B2 * | 9/2004 | Ikushima et al. | 438/57 |
| 6,830,945 B2 * | 12/2004 | Moon et al. | 438/22 |
| 6,852,615 B2 * | 2/2005 | Micovic et al. | 438/604 |
| 6,933,164 B2 * | 8/2005 | Kubena | 438/49 |
| 6,998,533 B2 * | 2/2006 | De Samber et al. | 174/521 |
| 2001/0017370 A1 * | 8/2001 | Sheppard et al. | 257/24 |
| 2002/0086456 A1 * | 7/2002 | Cunningham et al. | 438/57 |
| 2003/0045019 A1 * | 3/2003 | Kubena | 438/49 |
| 2003/0064535 A1 * | 4/2003 | Kub et al. | 438/22 |
| 2003/0178633 A1 * | 9/2003 | Flynn et al. | 257/101 |
| 2003/0227027 A1 * | 12/2003 | Micovic et al. | 257/192 |
| 2004/0012463 A1 * | 1/2004 | Kawakubo et al. | 333/187 |
| 2004/0051112 A1 * | 3/2004 | Moon et al. | 257/103 |
| 2004/0053435 A1 * | 3/2004 | Ikushima et al. | 438/57 |
| 2004/0075366 A1 | 4/2004 | Mehta | 310/336 |
| 2006/0131736 A1 * | 6/2006 | Jansman et al. | 257/712 |

FOREIGN PATENT DOCUMENTS

WO    WO 03/085736 A1 * 10/2003

OTHER PUBLICATIONS

Arscott, S., R.E. Miles and S.J. Milne, "Lead Zirconate Titanate Thin Films for Microwave Device Applications," Sol-Gel Materials for Device Applications, IEEE Proc.—Circuits Device Syst., vol. 145, No. 5, (Oct. 1998).

* cited by examiner

*Primary Examiner*—Stephen W Smoot
(74) *Attorney, Agent, or Firm*—Ladas & Parry LLP

(57) ABSTRACT

A process for fabricating a combined micro electromechanical/gallium nitride structure. The micro electromechanical structure comprises a piezoelectric device, such as a piezoelectric switch or a bulk acoustic wave device. According to the process, high Q compact bulk acoustic wave resonators can be built. The process is applicable to technologies such as tunable planar filter technology, amplifier technology and high speed analog-to-digital converters.

32 Claims, 10 Drawing Sheets

PIEZOELECTRIC MEMS INTEGRATION WITH GAN TECHNOLOGY

CROSS REFERENCE TO RELATED APPLICATIONS

This application claims the benefit of U.S. Provisional Application No. 60/563,598 for "Piezoelectric MEMS Integration with GaN Technology" by Sarabjit Mehta, David E. Grider and Wah S. Wong, filed on Apr. 19, 2004, which is incorporated herein by reference in its entirety.

BACKGROUND

1. Field

The present disclosure relates to micro-electromechanical systems (MEMS) and, in particular, to a method for integrating piezoelectric MEMS, such as PZT multimorph switches or bulk acoustic wave (BAW) resonators, with gallium nitride (GaN) technology and an apparatus integrating piezoelectric MEMS with GaN technology.

2. Related Art

The related art deals with the integration of PZT films with GaAs substrates, and the fabrication of PZT BAW devices on these substrates, as shown in "Lead Zirconate Titanate Thin Films for Microwave Device Applications", S. Arscott, R. E. Miles, and S. J. Milne, Sol-Gel Materials for Device Applications, IEEE proc.-Circuits Devices Syst., Vol. 145, no. 5, October 1998.

A BAW device comprises a piezoelectric layer placed between two electrodes. When a radio frequency (RF) signal is applied across the device, a mechanical wave is produced in the piezoelectric layer. The thickness of the piezoelectric layer determines the resonant frequency, and the fundamental resonance occurs when the wavelength of the mechanical wave is about twice the thickness of the piezoelectric layer. As the thickness of the piezoelectric layer is reduced, the resonance frequency is increased.

The prior art does not explicitly address integration issues of PZT and GaAs MMIC technology.

The present disclosure presents a significant advantage over the related art because it considers PZT/GaN MMIC process integration, as GaN is the material of choice for high power applications.

SUMMARY

According to a first aspect, a process for fabricating a combined micro electromechanical/gallium nitride (GaN) structure is provided, the process comprising: providing a substrate; depositing a GaN layer on the substrate; obtaining a GaN transistor structure; depositing and patterning a first metal layer on the GaN layer; depositing a non-metal separation layer on the GaN layer in correspondence of the GaN transistor structure; patterning the non-metal separation layer to form a protective region to protect the GaN transistor structure; depositing a sacrificial layer on the protective region, the patterned first metal layer and at least a portion of the GaN layer so as to leave a further portion of the GaN layer between the protective region and the patterned first metal layer exposed; depositing and patterning a second metal layer on the sacrificial layer; depositing a support layer on the sacrificial layer, the second metal layer and the exposed GaN layer; providing a piezoelectric structure on the support layer; patterning the support layer in proximity of the GaN transistor structure to provide access holes; removing the non-metal separation layer and the sacrificial layer from the proximity of the GaN transistor structure through the access holes; providing a metal overlay above the GaN transistor structure, the metal overlay forming a gate of the GaN transistor structure; providing a gate passivation layer above the gate of the GaN transistor structure; providing a further metal layer above the gate passivation layer; and removing the sacrificial layer between the first patterned metal layer and the second patterned metal layer.

According to a second aspect, an integrated gallium nitride (GaN) field emitter transistor (FET)/micro electromechanical switch device is provided.

According to a third aspect, an integrated gallium nitride (GaN) field emitter transistor (FET)/bulk acoustic wave (BAW) device is provided.

According to a fourth aspect, a process for fabricating a combined micro electromechanical/gallium nitride (GaN) structure is provided, the process comprising: depositing a GaN layer; obtaining a GaN transistor structure on the GaN layer; forming a first metal contact pad on the GaN layer; forming a protective region around the GaN transistor structure; depositing a sacrificial layer on the protective region and the first metal contact pad; forming a second metal contact pad on the sacrificial layer; depositing a support layer on the sacrificial layer and the second metal contact pad; providing a piezoelectric structure on the support layer; removing the sacrificial layer from the proximity of the GaN transistor structure; patterning the piezoelectric structure in correspondence of the first metal contact pad and the second metal contact pad; forming a gate of the GaN transistor structure; providing a gate passivation layer above the gate of the GaN transistor structure; providing a further metal layer above the gate passivation layer; and removing the sacrificial layer between the first metal contact pad and the second metal contact pad.

According to a fifth aspect, a process for fabricating a combined gallium nitride (GaN)/piezoelectric structure is provided, comprising: obtaining a GaN structure on a GaN layer; forming a first contact pad on the GaN layer separated from the GaN structure; forming a protective region around the GaN structure; depositing a sacrificial layer on the protective region and the first metal contact pad; forming a second metal contact pad on the sacrificial layer; depositing a support layer on the sacrificial layer and the second metal contact pad; providing a piezoelectric switch structure on the support layer; removing the sacrificial layer from the proximity of the GaN structure; and patterning the piezoelectric switch structure in correspondence of the first metal contact pad and the second metal contact pad.

According to a sixth aspect, a process for fabricating a combined gallium nitride (GaN)/piezoelectric structure is provided, comprising: obtaining a GaN structure on a GaN layer; forming a first contact pad on the GaN layer separated from the GaN structure; forming a protective region around the GaN structure; depositing a sacrificial layer on the protective region and the first metal contact pad; forming a second metal contact pad on the sacrificial layer; depositing a support layer on the sacrificial layer and the second metal contact pad; providing a piezoelectric bulk acoustic wave resonator structure on the support layer; removing the sacrificial layer from the proximity of the GaN structure; and patterning the piezoelectric switch structure in correspondence of the first metal contact pad and the second metal contact pad.

According to a seventh aspect, a process for fabricating a combined gallium nitride (GaN)/piezoelectric structure is provided, the process comprising: providing a substrate; depositing a GaN layer on the substrate; obtaining a GaN transistor structure; depositing a non-metal separation layer on the GaN layer in correspondence of the GaN transistor structure; patterning the non-metal separation layer to form a protective region around the GaN transistor structure; depositing a sacrificial layer on at least a portion of the GaN layer and on the protective region; creating at least a cavity in the sacrificial layer; depositing a support layer on the sacrificial layer and the cavity; providing a piezoelectric structure on the support layer; patterning the support layer in proximity of the GaN transistor structure to provide access holes; removing the non-metal separation layer and the sacrificial layer from the proximity of the GaN transistor structure through the access holes; patterning the piezoelectric structure in correspondence of the patterned first metal layer and patterned second metal layer; providing a metal overlay above the GaN transistor structure, the metal overlay forming a gate of the GaN transistor structure; providing a gate passivation layer above the gate of the GaN transistor structure; providing a further metal layer above the gate passivation layer; and removing the sacrificial layer between the GaN layer and the support layer.

The combination between PZT devices and GaN devices offers enhanced functionality of RF components. For example, PZT MEMS switches can be incorporated into tunable matching networks surrounding active GaN HEMT processing or environmental conditions. According to the present disclosure, tunable matching networks are integrated directly onto the GaN monolithic microwave integrated circuit (MMIC), thus providing on-chip reconfigurability. The PZT devices such as PZT switches and BAW devices are extremely small (e.g. 50×100 µm) so that minimal MMIC space is required.

According to the present disclosure, high Q, compact BAW resonators can be built, that can be in on-chip filters or tuning networks. Integrated BAW resonators are not only useful in microwave circuits (e.g. amplifiers, active Q enhanced filters, oscillators) but also high speed A/D converter front ends. This latter application takes advantage of the high Q of the PZT resonator to produce high spur free dynamic range of Delta-Sigma A/D converters, while the high breakdown voltage characteristics of GaN HEMT technology greatly extends the bandwidth, dynamic range and power dissipation of the A/D converter.

Possible applications of present disclosure relate to technologies such as active tunable planar filter and amplifier technology, and high speed A/D converters. For example, the teachings of the present disclosure can be applied to X-band front and selectable filter banks, advanced multifunction RF systems, UHF communication, satellite communications terminals, and wireless base stations.

BRIEF DESCRIPTION OF THE DRAWINGS

The present invention will be understood and appreciated more fully from the following detailed description taken in conjunction with the drawings in which.

DETAILED DESCRIPTION

The processing steps for both PZT MEMs structures and the GaN devices involve high temperature treatments at different steps. In order to successfully integrate the two technologies, the present disclosure will establish a proper combination of fabrication steps. Due to the nature of GaN materials, processing of a GaN high electron mobility transistor (HEMT) device is inherently not as trivial as for GaAs HEMT device, which makes process integration more complicated and difficult.

FIGS. 1-14 illustrate a preferred embodiment of the process according to the present disclosure. The process is performed using generally known microfabrication techniques, such as masking, etching, deposition and lift-off. While FIGS. 1-14 depict multiple fabrication steps, alternative fabrication processes may allow separate steps to be combined into fewer steps. Additionally, alternative fabrication processes may use a different sequence of steps.

Figure 1:
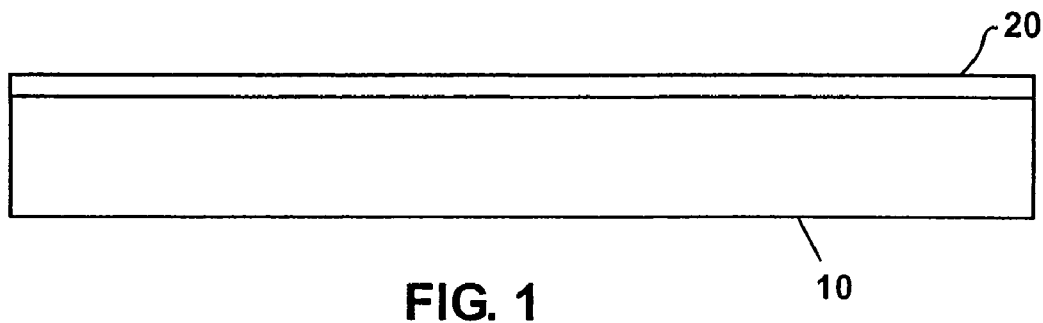
FIGS. 1-14 show steps of a process to fabricate a GaN-MEMS structure according to the present disclosure.

FIG. 1 shows a first step of the process, where a substrate 10 is provided and a GaN layer 20 is deposited on the substrate 10. The substrate used in the preferred embodiment may be a sapphire substrate or a SiC substrate, although other materials may be used. The GaN layer 20 is usually deposited by means of epitaxial deposition.

Figure 2:
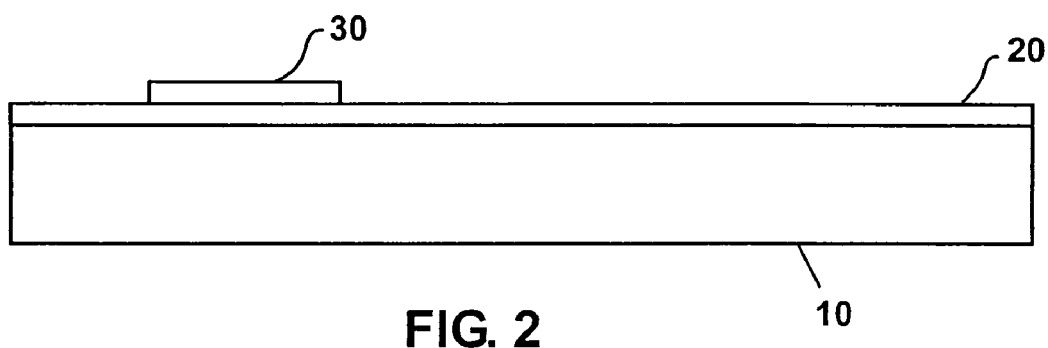

FIG. 2 shows a second step of the process, where a CaN transistor structure 30 is obtained, for example a GaN field emission transistor (FET), comprising a buffer layer, an active layer, and source, drain, and gate contacts. The structure 30 is only schematically represented in FIG. 2, because it is well known to the person skilled in the art. The GaN FET processing also comprises ohmic contact and device isolation steps. The ohmic contact step comprises a rapid thermal annealing process (RTA) at about 900° C. for about 30 seconds.

Figure 3:
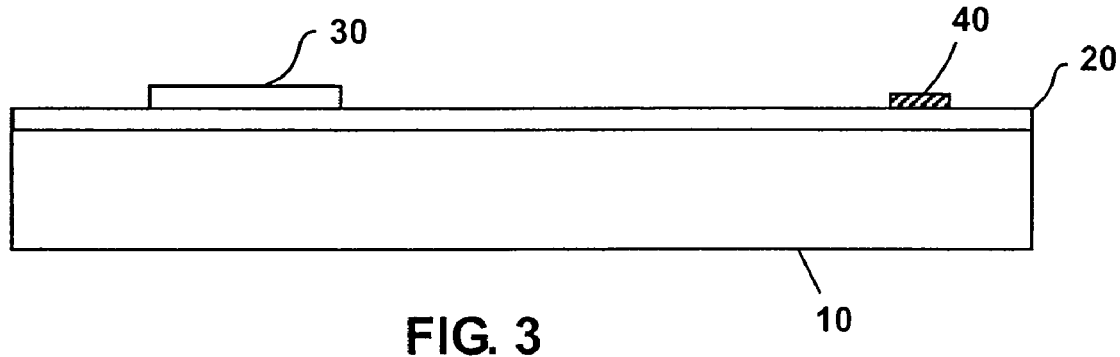

FIG. 3 shows a third step of the process, where a metal layer is deposited on the GaN layer 20 and patterned to form a bottom contact pad 40. The metal layer is, for example, a Ti/Pt layer about 0.1 µm thick. The metal layer is patterned using, for example, electron beam evaporation and liftoff. The FET structure 30 is protected during the metal layer deposition and patterning process.

Figure 4:
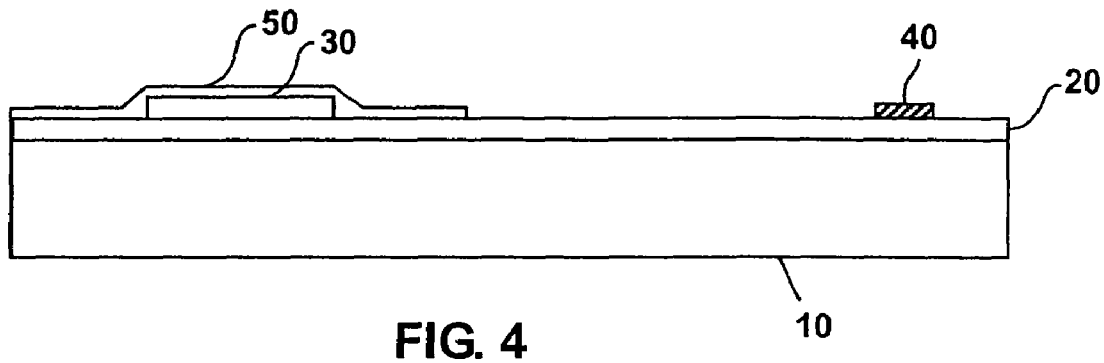

FIG. 4 shows a fourth step of the process, where a non-metal separation layer is deposited above the GaN layer 20 and patterned to form a protective region 50 protecting the FET structure 30. The non-metal separation layer is usually a 500 Å thick layer made of $Si_3N_4$, which is deposited using PECVD (Plasma Enhanced Chemical Vapor Deposition).

Figure 5:
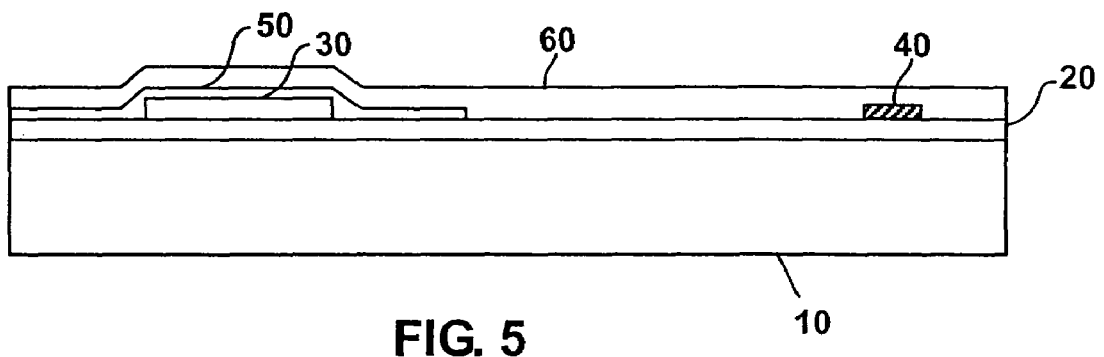

FIG. 5 shows a fifth step of the process, where a sacrificial layer 60 is deposited on the GaN layer 20, the protective region 50, and the contact pad 40. A sacrificial layer is a layer which is first deposited in a step of a process and then removed in a further step of the process. The thickness of the layer 60 will determine a distance between the contacts pads of the switch, i.e. the air gap of the switch, as later explained. Additionally, the layer 60 will also serve as a lift off layer to eventually remove any processing residue from the FET structure. The sacrificial layer 60 is, for example, an about 1 µm thick layer made of silicon dioxide ($SiO_2$) which may be deposited using PECVD.

Figure 6:
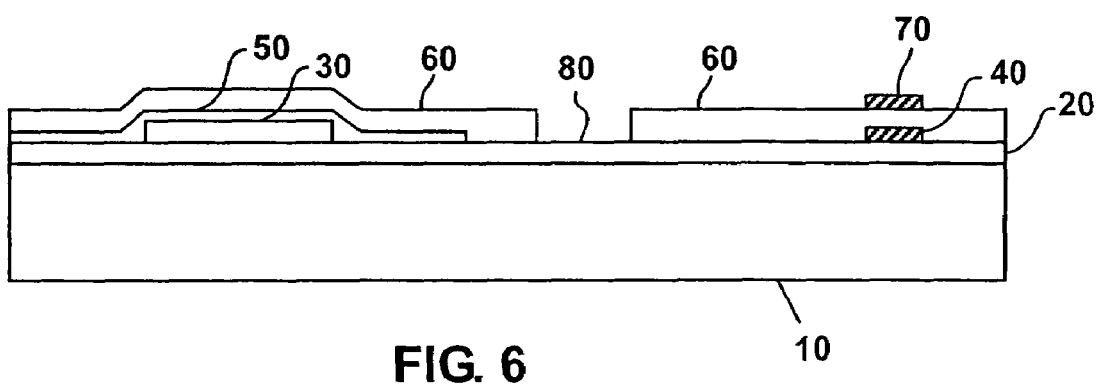

FIG. 6 shows a sixth and seventh step of the process. In the sixth step, a second metal layer is deposited on the sacrificial layer 60 and patterned to form a top contact pad 70 using, for example, electron beam evaporation and liftoff. The second metal layer is, for example, a 0.1 μm thick Ti/Pt layer. In the seventh step, the sacrificial layer 60 is etched (for example dry or wet etching). The etching step creates a hole or cavity 80 in the structure.

Figure 7:
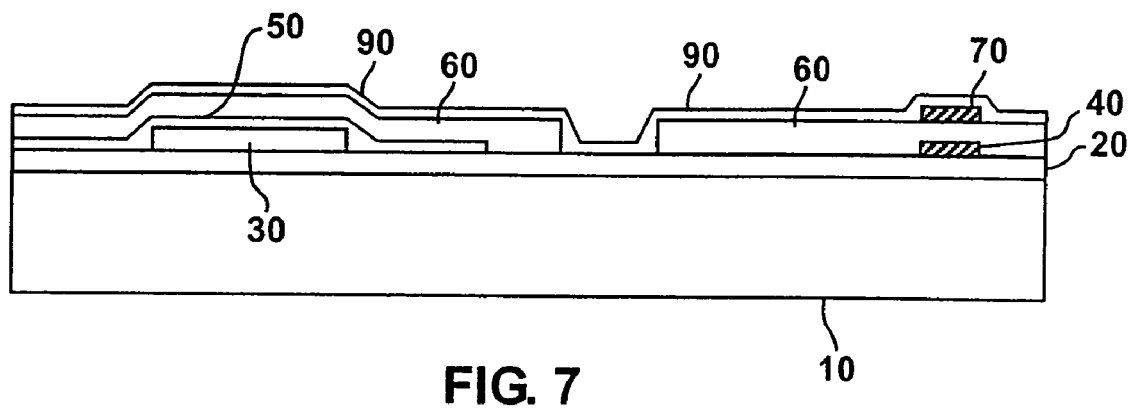

FIG. 7 shows an eighth step of the process, where a layer 90 is deposited above the sacrificial layer 60, the top contact pad 70, and the hole 80. The layer 90 is, for example, an about 0.1 to about 0.5 μm thick layer made of $Si_3N_4$, which is deposited using PECVD. The use of the layer 90 is preferred, because it provides support and mechanical strength to the final released structure of the switch. The thickness of the layer 90 may be adjusted to compensate for any stress related bending.

The layer 90 can be patterned at the present stage or later, depending on the etch method used for the piezoelectric layer 140 in FIG. 8 below. Should the piezoelectric layer 140 of FIG. 8 be etched through a dry etch process, the layer 90 can be patterned at the present stage. Should the piezoelectric layer 140 of FIG. 8 be etched through a wet etch process, the layer 90 is preferably patterned at a later stage, because it serves to protect the underlying sacrificial layer 60 from the etching chemicals, some of which may attack the sacrificial layer 60. The layer 90 also serves to better protect the FET region while processing for the piezoelectric layer is carried out.

Figure 8:
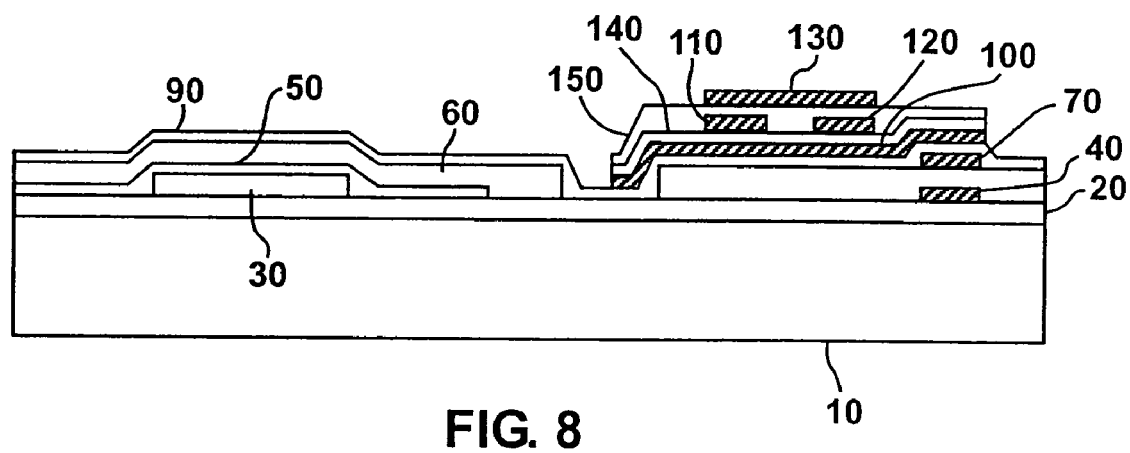

FIG. 8 shows further steps of the process, where deposition of metallic layers is alternated with deposition of piezoelectric layers. In particular, a first electrode 100, a second electrode 110, a third electrode 120, and a fourth electrode 130 are alternated with piezoelectric layers 140 and 150. The electrodes are patterned from metal layers. The metal layers are, for example, 0.1 μm thick Ti/Pt layers deposited using a liftoff technique. The piezoelectric layers are, for example, 0.5 μm thick lead zirconate titanate (PZT) or lead lanthanum zirconate titanate (PLZT) layers deposited using, for example, a sol-gel deposition technique. The process of depositing the layers 140, 150 preferably involves an annealing step at about 500-700° C. The annealing can either be a 1-15 seconds RTA or a 15 minutes furnace process. The layers 140, 150 can be patterned using a variety of dry or wet etch techniques.

Figure 9:
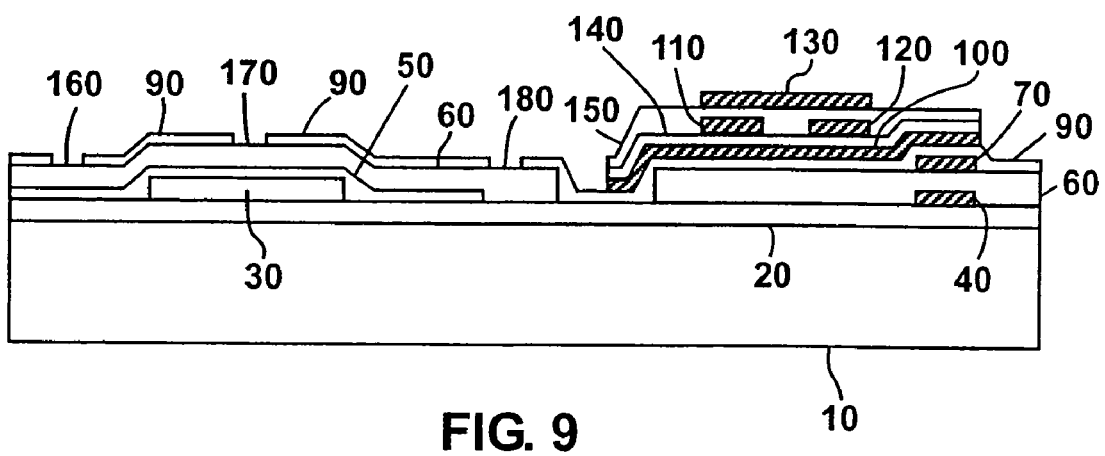

FIG. 9 shows a further step of the process, where the layer 90 is patterned to provide access holes 160, 170, 180 for the $SiO_2$ removal in the FET region only.

Figure 10:
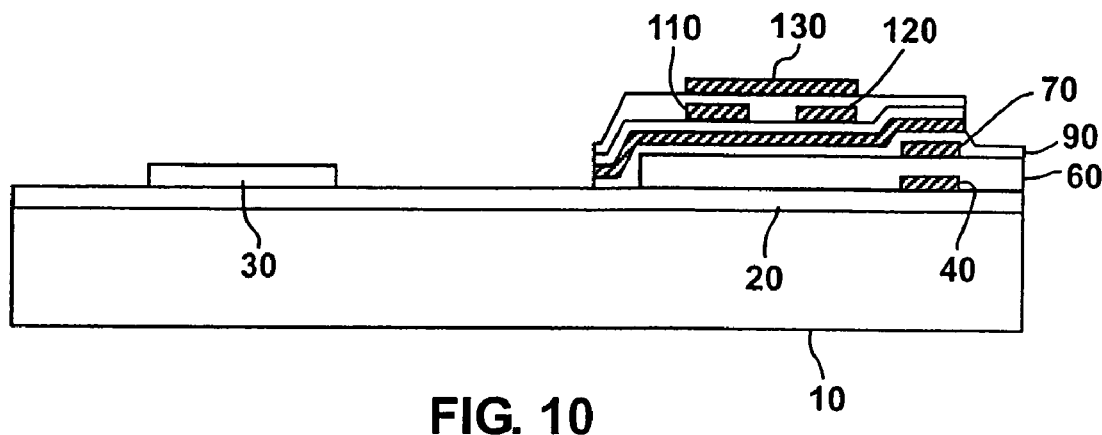

FIG. 10 shows a further step of the process, where the protective region 50 and the sacrificial layer 60 are removed from the FET region, for example by successive immersions in buffered oxide etchant (BOE) solution and/or by dry etching. The PZT regions 140, 150 are protected during this step.

Figure 11:
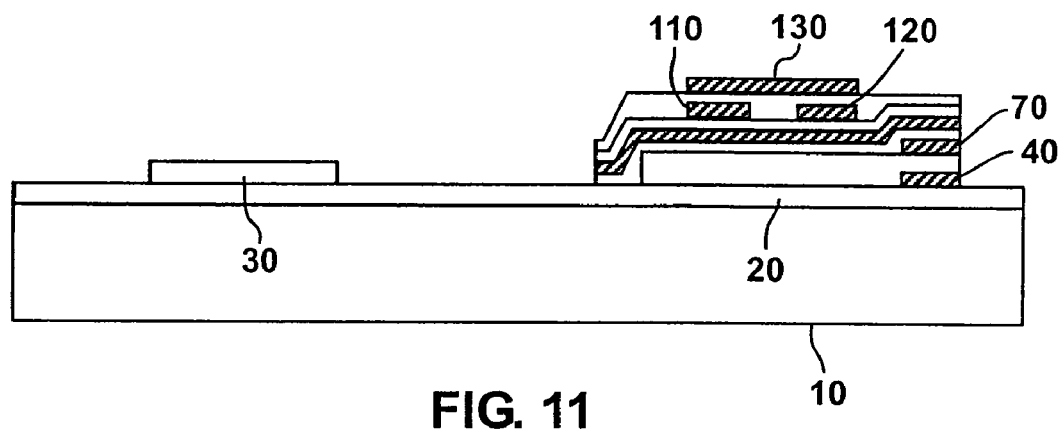

FIG. 11 shows a further step of the process, where the sacrificial layer 60 and layer 90 are patterned in correspondence of the bottom and top contact pads 40, 70. In particular, the layers 60, 90 are dry etched to define the switch outline and also to expose the outer parts of the contact pads. The FET region is protected during this step.

Figure 12:
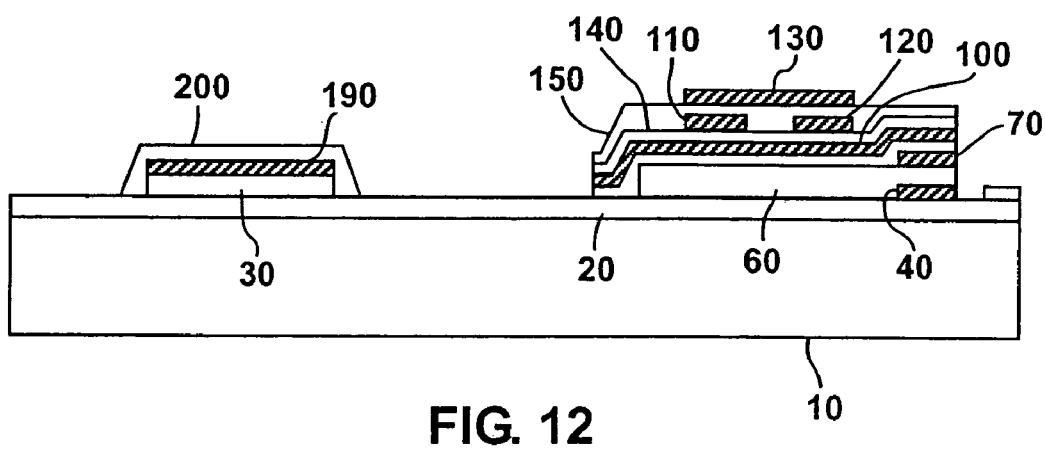

FIG. 12 shows a further step of the process, where the GaN FET process is started by defining the FET gate region, i.e. by providing a metal overlay 190 for the FET. The switch region is protected during this step. The metal overlay 190 can also be used to complete part or all of the switch circuitry, for example to form the electrode 130. The metal overlay step is followed by a gate passivation step by means, for example, of a $Si_3N_4$ layer 200. The PZT region is protected during this step.

Figure 13:
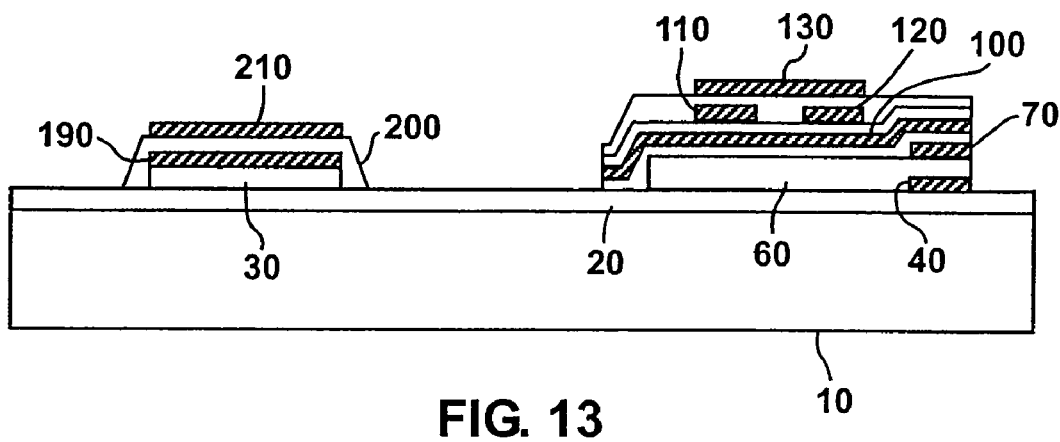

FIG. 13 shows a further step of the process, where a further metal layer 210 for the FET to build up gold thickness on the source, drain and gate pads for heat dissipation.

Figure 14:
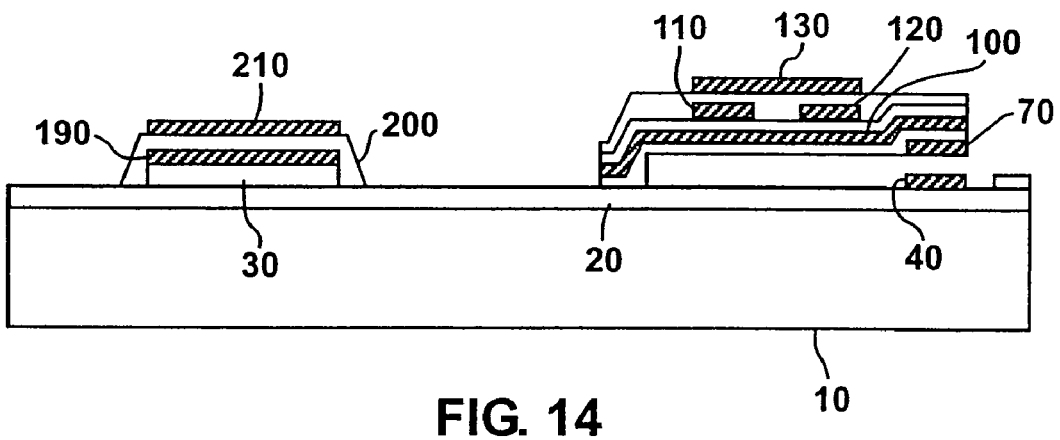

FIG. 14 shows a final step of the process, where the sacrificial layer 60 is removed, for example by means of a BOE process. This process is followed by a liquid $CO_2$ cleaning process to release the switch. This prevents any damage to the structure due to the trapped liquid. The FET region is protected during this step.

In a similar way, a GaN FET can be obtained together with a BAW device, as shown in the following FIGS. 15 and 16.

Figure 15:
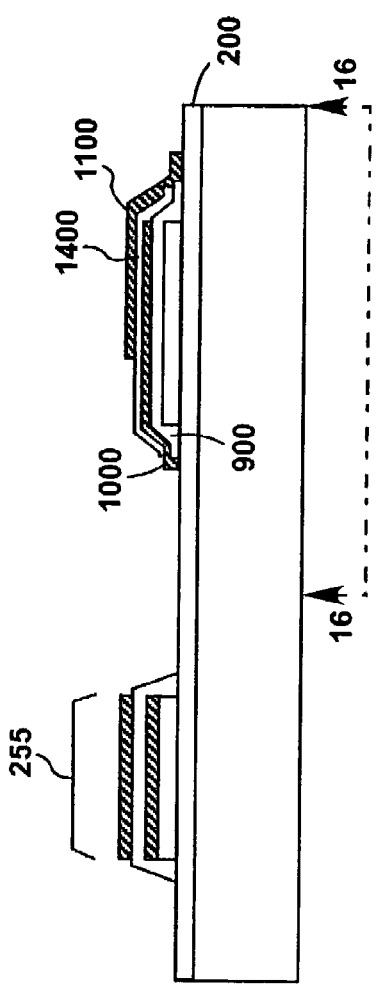
FIG. 15 shows a structure comprising a GaN FET and a BAW device, fabricated with the process in accordance with the present disclosure.

FIG. 15 shows a combined GaN FET/BAW structure. The BAW structure comprises a top electrode 1100, a bottom electrode 1000, a piezoelectric active layer 1400, and a $Si_3N_4$ substrate 900, together with a GaN FET structure 255. The BAW resonator shown in FIG. 15 is released from the substrate to increase the Q-factor.

Figure 16:
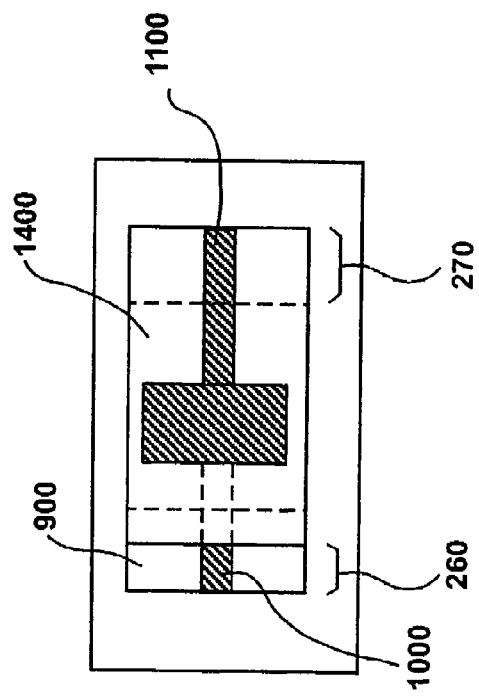
FIG. 16 shows a top view of a BAW portion of FIG. 15.

FIG. 16 shows a top view taken along section 16-16 of FIG. 15 where also the supported areas 260, 270 of the BAW device are shown.

FIGS. 17-28 illustrate a further embodiment of the process according to the present disclosure for obtaining the device of FIGS. 15 and 16. The process is performed using generally known microfabrication techniques, such as masking, etching, deposition and lift-off. While FIGS. 17-28 depict multiple fabrication steps, alternative fabrication processes may allow separate steps to be combined into fewer steps. Additionally, alternative fabrication processes may use a different sequence of steps.

Figure 17:
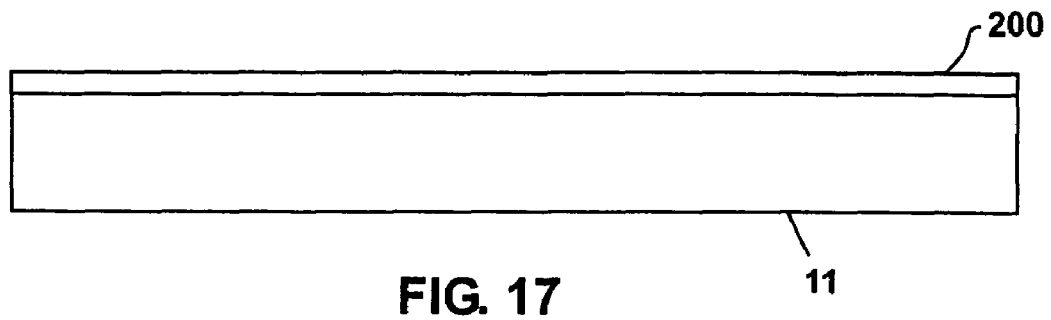
FIGS. 17-28 show steps of a process to fabricate a GaN-BAW structure according to the present disclosure.

FIG. 17 shows a first step of the exemplary process, where a substrate 11 is provided and a GaN layer 200 is deposited on the substrate 11. The substrate used in the exemplary embodiment may be a sapphire substrate or a SiC substrate, although other materials may be used. The GaN layer 200 is usually deposited by means of epitaxial deposition.

Figure 18:
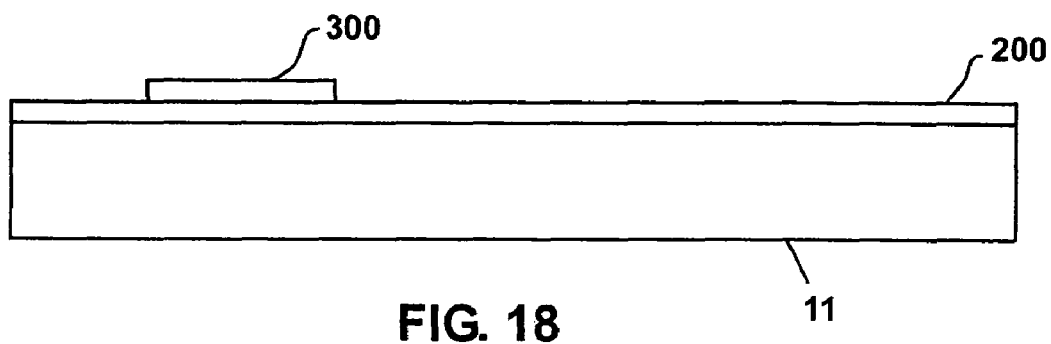

FIG. 18 shows a second step of the process, where a GaN transistor structure 300 is obtained, for example a GaN field emission transistor (FET), comprising a buffer layer, an active layer, and source, drain, and gate contacts. The structure 300 is only schematically represented in FIG. 18, because well known to the person skilled in the art. The GaN FET processing also comprises ohmic contact and device isolation steps. The ohmic contact step comprises a rapid thermal annealing process (RTA) at about 900° C. for about 30 seconds.

Figure 19:
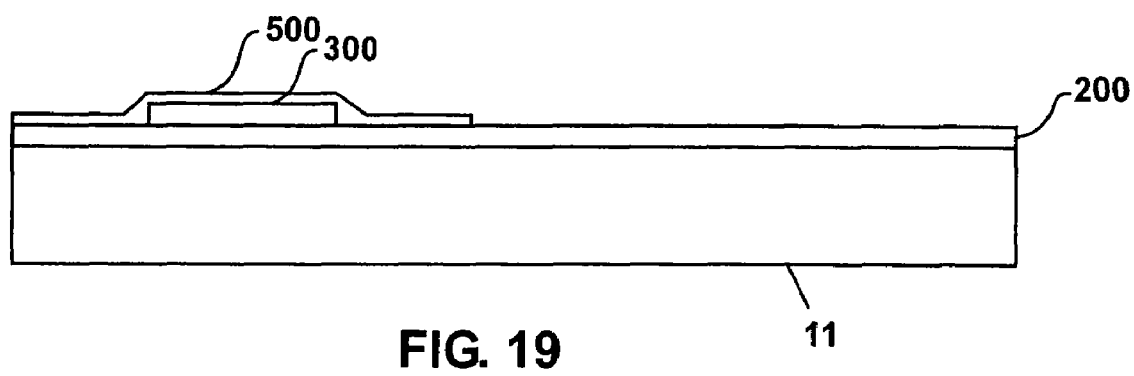

FIG. 19 shows a third step of the process, where a non-metal separation layer is deposited above the GaN layer 200 and patterned to form a protective region 500 protecting the FET structure 300. The non-metal separation layer is usually a 500 Å thick layer made of $Si_3N_4$, which is deposited using PECVD (Plasma Enhanced Chemical Vapor Deposition).

Figure 20:
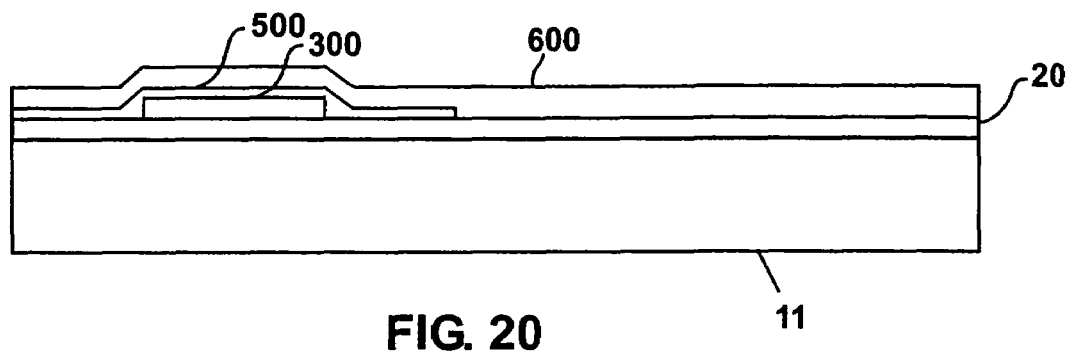

FIG. 20 shows a fourth step of the process, where a sacrificial layer 600 is deposited on the GaN layer 200 and the protective region 500. A sacrificial layer is a layer which is first deposited in a step of a process and then removed in a further step of the process. The thickness of the layer 600 will determine a distance between the contacts pads of the switch, i.e. the air gap of the switch, as later explained. Additionally, the layer 600 will also serve as a lift off layer to eventually remove any processing residue from the FET structure. The sacrificial layer 600 is, for example, an about 1 μm thick layer made of silicon dioxide ($SiO_2$) which may be deposited using PECVD.

Figure 21:
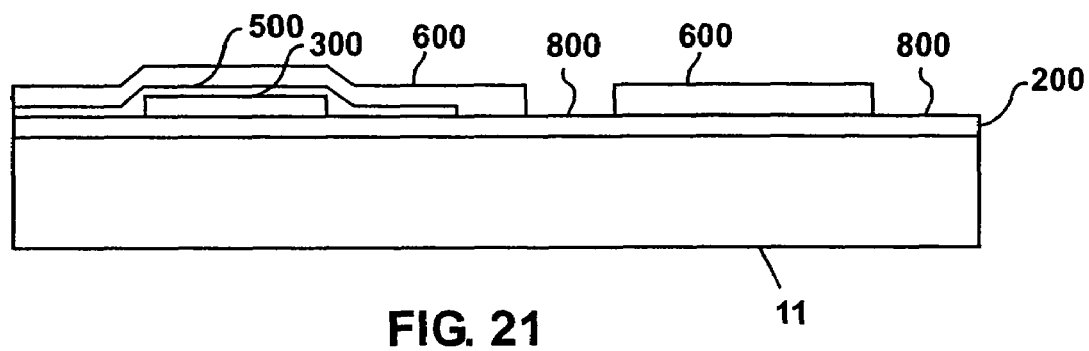

FIG. 21 shows a fifth of the process, where the sacrificial layer 600 is etched (for example dry or wet etching). The etching step creates holes or cavities 800 in the structure.

Figure 22:
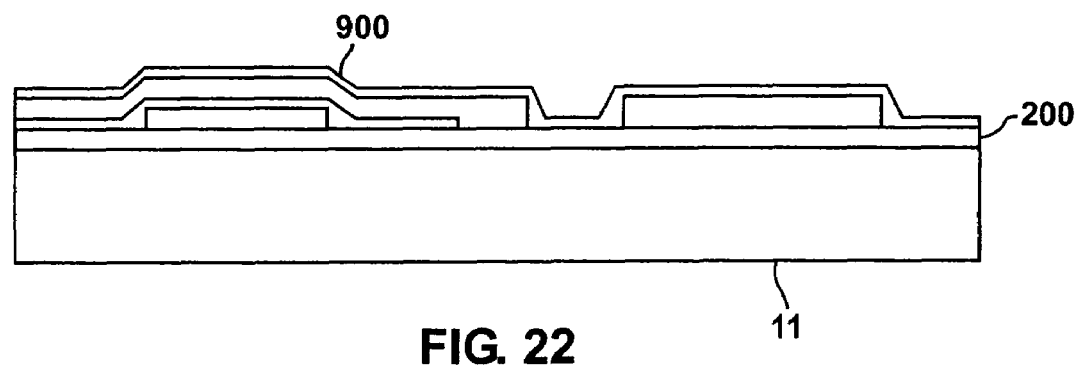

FIG. 22 shows a sixth step of the process, where a layer 900 is deposited above the sacrificial layer 600 and the holes 800. The layer 900 is, for example, an about 0.1 to about 0.5 μm thick layer made of $Si_3N_4$, which is deposited using PECVD.

The layer 900 can be patterned at the present stage or later, depending on the etch method used for the piezoelectric layer 1400 in FIG. 23 below. Should the piezoelectric layer 1400 of FIG. 23 be etched through a dry etch process, the layer 900 can be patterned at the present stage. Should the piezoelectric layer 1400 of FIG. 23 be etched through a wet etch process, the layer 900 is preferably patterned at a later stage, because it serves to protect the underlying sacrificial layer 600 from the etching chemicals, some of which may attack the sacrificial layer 600. The layer 900 also serves to better protect the FET region while processing for the piezoelectric layer is carried out.

Figure 23:
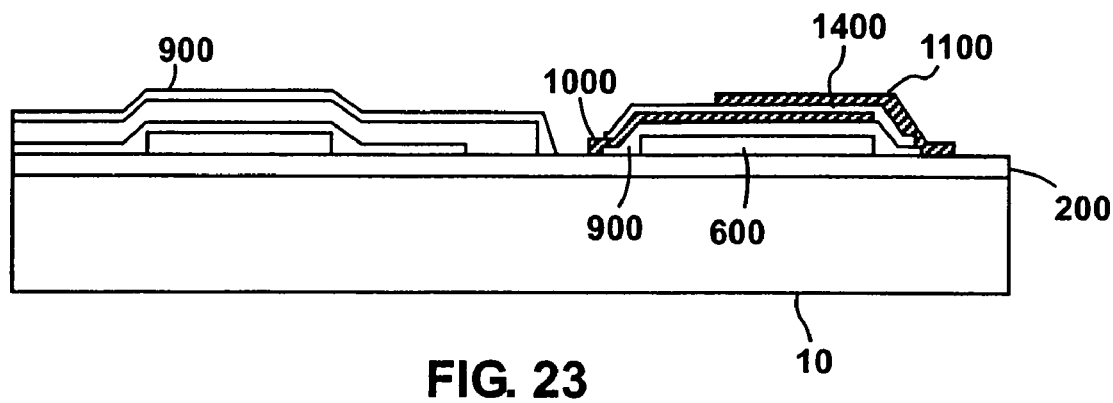

FIG. 23 shows further steps of the process, where deposition of metallic layers is alternated with deposition of piezoelectric layer. In particular, a first electrode 1000 and a second electrode 1100 are alternated with piezoelectric layer 1400. The electrodes 1000, 1100 are patterned from metal layers. The metal layers are, for example, 0.1 μm thick Ti/Pt layers deposited using a liftoff technique. The piezoelectric layer 1400 is, for example, 0.5 μm thick lead zirconate titanate (PZT) or lead lanthanum zirconate titanate (PLZT) layers deposited using, for example, a sol-gel deposition technique. The process of depositing the layer 1400 preferably involves an annealing step at about 500-700° C. The annealing can either be a 1-15 seconds RTA or a 15 minutes furnace process. The layer 1400 can be patterned using a variety of dry or wet etch techniques.

Figure 24:
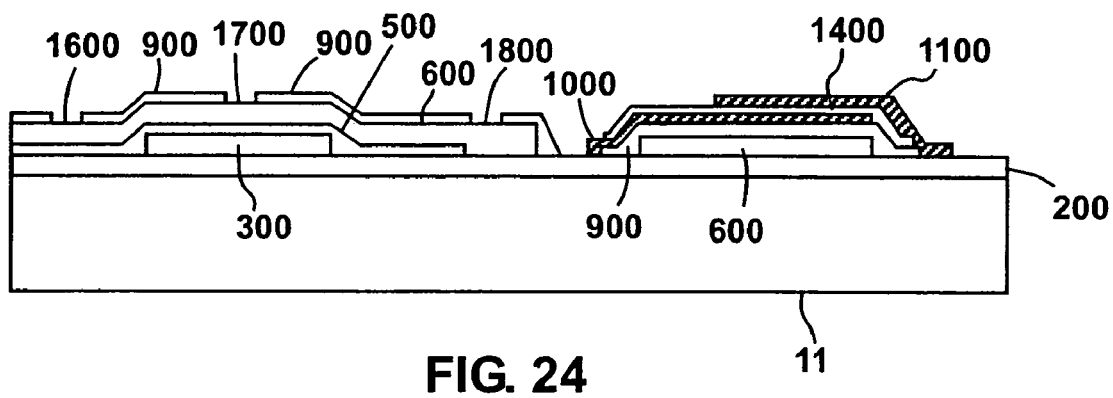

FIG. 24 shows a further step of the process, where the layer 900 is patterned to provide access holes 1600, 1700, 1800 for the $SiO_2$ removal in the FET region only.

Figure 25:
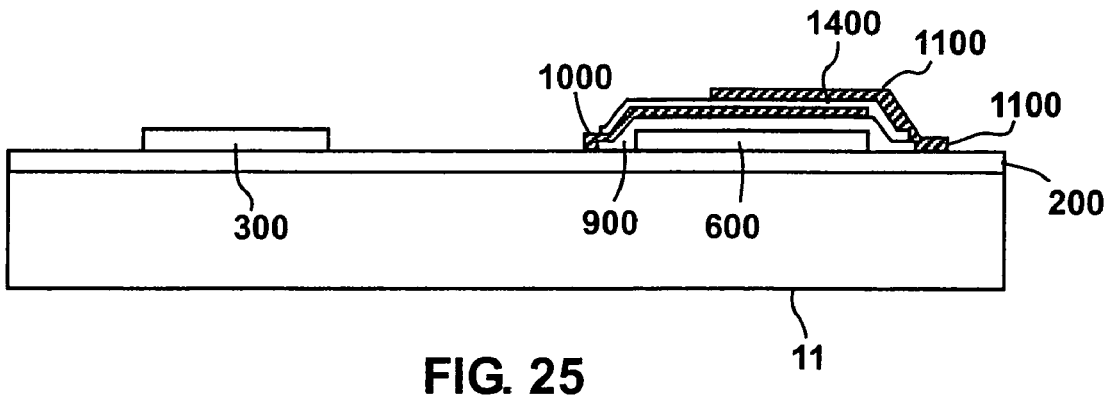

FIG. 25 shows a further step of the process, where the protective region 500 and the sacrificial layer 600 are removed from the FET region, for example by successive immersions in buffered oxide etchant (BOE) solution and/or by dry etching. The PZT region 1400 are protected during this step.

Figure 26:
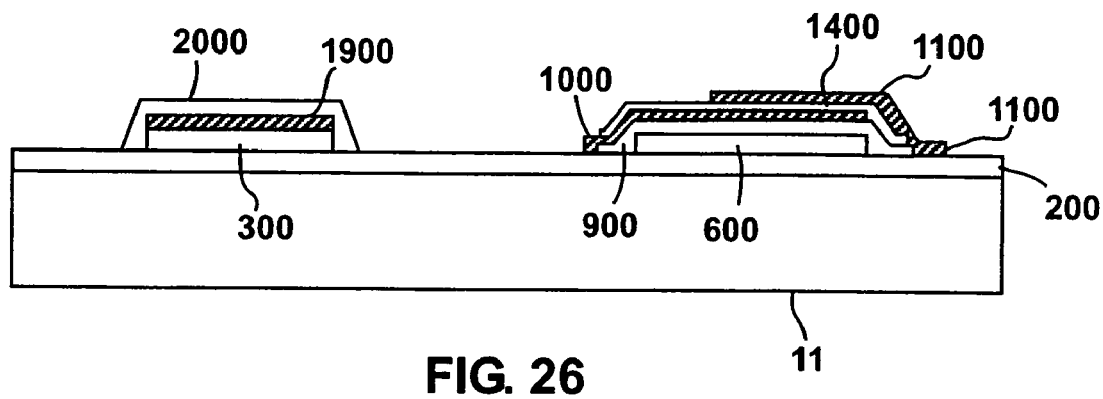

FIG. 26 shows a further step of the process, where the GaN FET process is started by defining the FET gate region, i.e. by providing a metal overlay 1900 for the FET. The BAW region is protected during this step. The metal overlay step is followed by a gate passivation step by means, for example, of a $Si_3N_4$ layer 2000. The PZT region is protected during this step.

Figure 27:
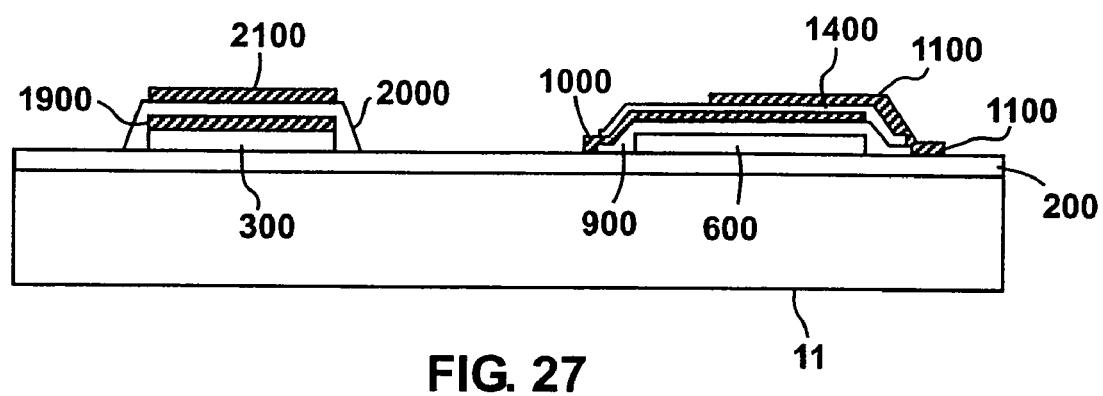

FIG. 27 shows a further step of the process, where a further metal layer 2100 may be deposited for the FET to build up gold thickness on the source, drain and gate pads for heat dissipation.

Figure 28:
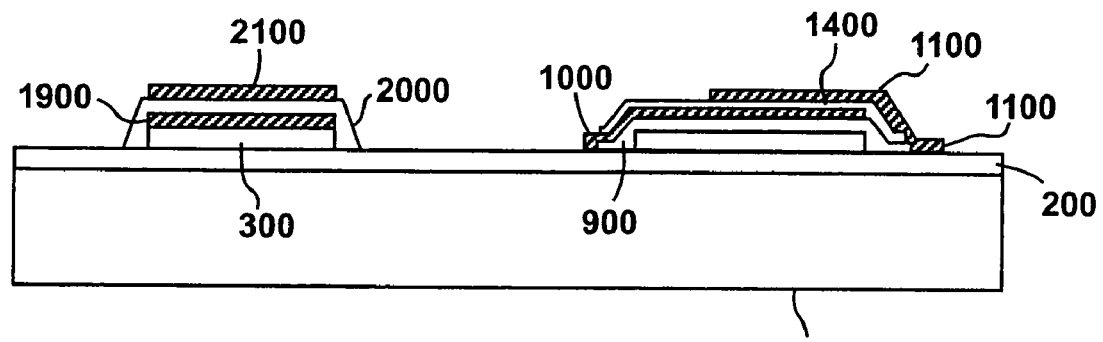

FIG. 28 shows a final step of the process for obtaining the device of FIGS. 15 and 16, where the sacrificial layer 600 is removed, for example by means of a BOE process. The FET region is protected during this step.

While several illustrative embodiments of the invention have been shown and described, numerous variations and alternative embodiments will occur to those skilled in the art. Such variations and alternative embodiments are contemplated, and can be made without departing from the scope of the invention as defined in the appended claims.

The foregoing detailed description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "step(s) for . . . ."

What is claimed is:

1. A process for fabricating a combined micro electromechanical/gallium nitride (GaN) structure, the process comprising:
   providing a substrate;
   depositing a GaN layer on the substrate;
   obtaining a GaN transistor structure;
   depositing and patterning a first metal layer on the GaN layer;
   depositing a non-metal separation layer on the GaN layer and on the GaN transistor structure;
   patterning the non-metal separation layer to form a protective region to protect the GaN transistor structure;
   depositing a sacrificial layer on the protective region, the patterned first metal layer and at least a portion of the GaN layer so as to leave a further portion of the GaN layer between the protective region and the patterned first metal layer exposed;
   depositing and patterning a second metal layer on the sacrificial layer;
   depositing a support layer on the sacrificial layer, the patterned second metal layer and the exposed GaN layer;
   providing a piezoelectric structure on the support layer;
   patterning the support layer in proximity of the GaN transistor structure to provide access holes;
   removing the non-metal separation layer and the sacrificial layer from the proximity of the GaN transistor structure through the access holes;
   providing a metal overlay above the GaN transistor structure, the metal overlay forming a gate of the GaN transistor structure;
   providing a gate passivation layer above the gate of the GaN transistor structure;
   providing a further metal layer above the gate passivation layer; and
   removing the sacrificial layer between the first patterned metal layer and the second patterned metal layer.

2. The process of claim 1, wherein the GaN transistor structure is a GaN FET structure.

3. The process of claim 1, wherein the step of obtaining a GaN transistor structure comprises a step of providing ohmic contacts and a device isolation step.

4. The process of claim 1, wherein the GaN transistor structure is protected during the step of depositing and patterning the first metal layer on the GaN layer.

5. The process of claim 1, wherein the patterned first contact layer and second contact layer form respective first and second contact pads.

6. The process of claim 5, wherein the second contact pad is located above the first contact pad.

7. The process of claim 1, wherein the support layer has an adjustable thickness to compensate for any stress related bending.

8. The process of claim 1, wherein piezoelectric regions of the piezoelectric structure are protected during the step of removing the non-metal separation layer and the sacrificial layer from the GaN transistor structure through the access holes.

9. The process of claim 1, wherein the piezoelectric structure is protected during the step of providing a metal overlay above the GaN transistor structure.

10. The process of claim 1, wherein the metal overlay is used to provide a metal portion of the piezoelectric structure.

11. The process of claim 10, wherein the metal portion of the piezoelectric structure is an electrode of the piezoelectric structure.

12. The process of claim 1, wherein the piezoelectric structure is protected during the step of providing a gate passivation layer above the gate.

13. The process of claim 1, wherein the piezoelectric structure is a MEMS piezoelectric switch.

14. An integrated gallium nitride (GaN) field emitter transistor (FET)/micro electromechanical switch device fabricated with a process according to claim 1.

15. An integrated gallium nitride (GaN) field emitter transistor (FET) disposed on a first surface of a gallium nitride (GaN) substrate and a piezoelectric micro electromechanical switch device also disposed on said first surface of said gallium nitride (GaN) substrate.

16. A process for fabricating a combined micro electromechanical/gallium nitride (GaN) structure, the process comprising:
depositing a GaN layer;
obtaining a GaN transistor structure on the GaN layer;
forming a first metal contact pad on the GaN layer;
forming a protective region around the GaN transistor structure;
depositing a sacrificial layer on the protective region and the first metal contact pad;
forming a second metal contact pad on the sacrificial layer;
depositing a support layer on the sacrificial layer and the second metal contact pad;
providing a piezoelectric structure on the support layer;
removing the sacrificial layer from the proximity of the GaN transistor structure;
patterning the piezoelectric structure in correspondence of the first metal contact pad and the second metal contact pad;
forming a gate of the GaN transistor structure;
providing a gate passivation layer above the gate of the GaN transistor structure;
providing a further metal layer above the gate passivation layer; and
removing the sacrificial layer between the first metal contact pad and the second metal contact pad.

17. The process of claim 16, wherein the piezoelectric structure is a piezoelectric switch.

18. The process of claim 17, wherein the piezoelectric switch comprises electrode layers alternated with piezoelectric layers.

19. A process for fabricating a combined gallium nitride (GaN)/piezoelectric structure comprising:
obtaining a GaN structure on a GaN layer;
forming a first metal contact pad on the GaN layer separated from the GaN structure;
forming a protective region around the GaN structure;
depositing a sacrificial layer on the protective region and the first metal contact pad;
forming a second metal contact pad on the sacrificial layer;
depositing a support layer on the sacrificial layer and the second metal contact pad;
providing a piezoelectric switch structure on the support layer;
removing the sacrificial layer from the proximity of the GaN structure; and
patterning the piezoelectric switch structure in correspondence of the first metal contact pad and the second metal contact pad.

20. A process for fabricating a combined gallium nitride (GaN)/piezoelectric structure comprising:
obtaining a GaN structure on a GaN layer;
forming a first metal contact pad on the GaN layer separated from the GaN structure;
forming a protective region around the GaN structure;
depositing a sacrificial layer on the protective region and the first metal contact pad;
forming a second metal contact pad on the sacrificial layer;
depositing a support layer on the sacrificial layer and the second metal contact pad;
providing a piezoelectric bulk acoustic wave resonator structure on the support layer;
removing the sacrificial layer from the proximity of the GaN structure; and
patterning the piezoelectric switch structure in correspondence of the first metal contact pad and the second metal contact pad.

21. An integrated gallium nitride (GaN) field emitter transistor (FET)/micro electromechanical switch device fabricated according to the process of claim 20.

22. A process for fabricating a combined micro electromechanical/gallium nitride (GaN) structure, the process comprising:
providing a substrate;
depositing a GaN layer on the substrate;
obtaining a GaN transistor structure;
depositing a non-metal separation layer on the GaN layer in correspondence of the GaN transistor structure;
patterning the non-metal separation layer to form a protective region around the GaN transistor structure;
depositing a sacrificial layer on at least a portion of the GaN layer and on the protective region;
creating at least a cavity in the sacrificial layer;
depositing a support layer on the sacrificial layer and the cavity;
providing a piezoelectric structure on the support layer;
patterning the support layer in proximity of the GaN transistor structure to provide access holes;
removing the non-metal separation layer and the sacrificial layer from the proximity of the GaN transistor structure through the access holes;
patterning the piezoelectric structure in correspondence of a patterned first metal layer and patterned second metal layer;
providing a metal overlay above the GaN transistor structure, the metal overlay forming a gate of the GaN transistor structure;
providing a gate passivation layer above the gate of the GaN transistor structure;
providing a further metal layer above the gate passivation layer; and
removing the sacrificial layer between the GaN layer and the support layer.

23. The process of claim 22, wherein the GaN transistor structure is a GaN FET structure.

24. The process of claim 22, wherein the support layer has an adjustable thickness to compensate for any stress related bending.

25. The process of claim 22, wherein piezoelectric regions of the piezoelectric structure are protected during the step of removing the non-metal separation layer and the sacrificial layer from the GaN transistor structure through the access holes.

26. The process of claim 22, wherein the piezoelectric structure is protected during the step of providing a metal overlay above the GaN transistor structure.

27. The process of claim 22, wherein the piezoelectric structure is protected during the step of providing a gate passivation layer above the gate.

28. The process of claim 22, wherein the piezoelectric structure is a bulk acoustic wave (BAW) device.

29. An integrated gallium nitride (GaN) field emitter transistor (FET)/bulk acoustic wave (BAW) device fabricated with a process according to claim 22.

30. An integrated gallium nitride (GaN) field emitter transistor (FET) disposed on a first surface of a gallium nitride (GaN) substrate and a bulk acoustic wave (BAW) device also disposed on said first surface of said gallium nitride (GaN) substrate.

31. A process for fabricating a combined micro electromechanical/gallium nitride (GaN) structure, the process comprising:

depositing a GaN layer;

obtaining a GaN transistor structure on the GaN layer;

forming a first contact pad on the GaN layer;

forming a protective region around the GaN transistor structure;

depositing a sacrificial layer on the protective region and the first contact pad;

forming a second contact pad on the sacrificial layer;

depositing a support layer on the sacrificial layer and the second contact pad;

providing a piezoelectric structure on the support layer;

removing the sacrificial layer from the proximity of the GaN transistor structure;

patterning the piezoelectric structure in correspondence of the first contact pad and the second contact pad; and removing the sacrificial layer between the first contact pad and the second contact pad.

32. The process of claim 31, wherein the piezoelectric structure is a piezoelectric switch.

* * * * *